United States Patent
Wolters et al.

(10) Patent No.: US 7,067,424 B2
(45) Date of Patent: Jun. 27, 2006

(54) METHOD OF MANUFACTURING AN ELECTRONIC DEVICE

(75) Inventors: Robertus Adrianus Maria Wolters, Eindhoven (NL); Anouk Maria Van Graven Claassen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 218 days.

(21) Appl. No.: 10/499,258

(22) PCT Filed: Dec. 6, 2001

(86) PCT No.: PCT/IB02/05267

§ 371 (c)(1), (2), (4) Date: Jun. 17, 2004

(87) PCT Pub. No.: WO03/052814

PCT Pub. Date: Jun. 26, 2003

(65) Prior Publication Data

US 2005/0130406 A1  Jun. 16, 2005

(30) Foreign Application Priority Data

Dec. 19, 2001 (EP) .................................. 01205015

(51) Int. Cl.
*H01L 21/44* (2006.01)

(52) U.S. Cl. .................. 438/687; 438/627; 438/643; 438/653; 438/637; 438/674; 438/678; 438/648; 438/694

(58) Field of Classification Search ............... 438/687, 438/627, 643, 653, 637, 674, 678, 648, 694
See application file for complete search history.

(56) References Cited

U.S. PATENT DOCUMENTS

| | | | |
|---|---|---|---|
| 6,242,349 B1 | 6/2001 | Nogami et al. | |
| 6,268,291 B1 | 7/2001 | Andricacos et al. | |
| 6,368,961 B1 * | 4/2002 | Lopatin et al. | 438/653 |
| 6,440,854 B1 * | 8/2002 | Rozbicki | 438/687 |
| 6,554,914 B1 * | 4/2003 | Rozbicki et al. | 148/238 |
| 6,955,986 B1 * | 10/2005 | Li | 438/687 |
| 2001/0051420 A1 * | 12/2001 | Besser et al. | 438/597 |

* cited by examiner

*Primary Examiner*—Asok K. Sarkar
*Assistant Examiner*—Victor V. Yevsikov
(74) *Attorney, Agent, or Firm*—Adam L. Stroud

(57) ABSTRACT

The present invention provides for a method of providing copper metallization on a semiconductor body, including the step of depositing copper in a nitrogen-containing atmosphere so as to form a nitrogen-containing copper seed layer and forming the copper metallization on the seed layer, and also including the step of heating the seed layer so as to release the nitrogen to form part of a barrier layer separating the seed layer from the semiconductor body.

8 Claims, 3 Drawing Sheets

METHOD OF MANUFACTURING AN ELECTRONIC DEVICE

The invention relates to a method of manufacturing a semiconductor device provided with a copper metallization on a substrate, which copper metallization comprises a seed layer and a copper metallization layer, which method comprises the steps of depositing copper in a nitrogen containing atmosphere so as to form a nitrogen- and copper-containing seed layer, and of forming the copper metallization layer on the said seed layer.

The invention also relates to an electronic device provided with a substrate on which a stack of a barrier layer comprising a metal nitride and a copper metallization are present, which barrier layer and copper metallization have a mutual interface.

It is well known to provide connectivity within integrated circuits by means of metallization connection layers and paths. One metallization material that is becoming increasingly popular in the semiconductor industry is copper. However, disadvantages exist in that copper is found to diffuse rapidly through a variety of materials and in particular through dielectric materials such as oxide.

Semiconductor structures seeking to employ copper metallization are therefore provided with a barrier material which serves to separate the copper metallization from the underlying material of the semiconductor body and so prevent such diffusion into the body. Nitride-containing barrier materials prove a popular choice but nevertheless exhibit disadvantages with regard to the degree of adhesion that can be achieved between such barrier layers and the copper seed layer which is deposited on the barrier layer prior to the subsequent electro-deposition of the copper metallization layer. Disadvantages also arise in relation to the sheet resistance offered by the copper metallization traces formed as part of such a structure.

U.S. Pat. No. 6,174,799 discloses an electronic device and a corresponding method of manufacturing of the kind described in the opening paragraph. In the known method the seed layer comprises an alloy of copper and either magnesium, tin or aluminum. This seed layer is deposited in a nitrogen atmosphere whose concentration decreases as the seed deposition proceeds so as to provide for a seed layer exhibiting a graded nitrogen content. The grading of the nitrogen content is such that the region of the seed layer proximate to the barrier layer has a high concentration of nitrogen, whereas the region of the seed layer remote from the barrier layer, i.e. forming the surface upon which the copper metallization layer is to be electro-deposited, has a low concentration of, or no nitrogen. Alternatively, the seed layer can contain three sublayers that differ in nitrogen content. It is considered that adequate adhesion of the seed layer to both the barrier layer and the copper metallization layer can then be achieved.

It is a disadvantage that the known method is unnecessarily complex, particularly with regard to the need to control the nitrogen atmosphere so as to provide for the graded seed layer.

It is, therefore, a first object of the invention to provide a method as defined above in which there is no need to control the nitrogen atmosphere and which offers nevertheless adequate adhesion of the seed layer to both the barrier layer and the copper metallization layer.

It is a second object of the invention to provide an electronic device as defined in the opening paragraph in which there is adequate adhesion between the barrier layer and the copper metallization.

The first object is realized in that before forming the copper metallization the seed layer is heated so as to release the nitrogen content thereof to form part of a barrier layer separating the seed layer from the substrate.

The second object is realized in that that the barrier layer is nitrogen-rich in a region at the interface resulting from diffusion of nitrogen through the interface.

The heating of the seed layer advantageously causes the nitrogen containing copper to decompose which advantageously gives rise to a decrease in sheet resistance along with the required release of nitrogen. The released nitrogen effectively nitridates the underlying region of the substrate so as to provide for a barrier region serving to block diffusion of the copper seed layer, and also of the later deposited copper metallization layer, into the substrate. This advantageous improvement in the functionality of the barrier is effectively achieved in situ with the copper seed layer already in place. Thus, the required adhesion of the copper seed layer to the semiconductor body is already achieved prior to the nitridation of the underlying region which is required so as to provide for an effective barrier layer.

In the method of the invention the seed layer is heated before the copper metallization layer is applied. If the heating were applied at a later stage, it would not work. The copper metallization layer is generally applied by means of electroplating and can be polished by chemomechanical polishing thereafter. If the heating were applied after electroplating, the application of the heating would heat up this copper metallization layer. This would lead to renewed crystallization, and possibly to cracks in the copper metallization layer. If the heating were applied at any later stage, the diffusion of the nitrogen would not be carried out effectively.

It may also be that the method of the invention is applied twice or more often in the manufacture of one electronic device. The sensitivity of the copper metallization to the heating step will not be high enough to become defective after the surplus of the copper metallization has been removed by the polishing. It is thus possible to provide a first copper metallization, including the heating step to effect diffusion of the nitrogen, and afterwards to provide a second copper metallization, including another heating step to effect diffusion of the nitrogen of the seed layer of the second copper metallization.

Although the heating step directly after the deposition of the seed layer is preferred to obtain the diffusion of the nitrogen into the barrier layer, this diffusion can be obtained as well in other ways, such as an elevated pressure, the presence of a katalysator.

Due to the diffusion and the subsequent nitridation or nitride enrichment of the underlying substrate, a region with a gradually changing nitrogen content will develop at the interface between barrier layer and copper metallization. As a result, the adhesion between the barrier layer and the copper metallization will be adequate. The adhesion between the seed layer and the copper metallization layer will be adequate as well due to the diffusion of the nitrogen out of the copper seed layer. This adhesion can be optimized through the choice of the nitrogen content of the copper seed layer.

JP07090546 discloses a semiconductor device with a copper metallization on a substrate that is obtained by sputtering a target using copper and a nitrogen-containing gas. This leads to a nitrogen-containing copper metallization with 0.2–17% nitrogen. However, there is no indication that a heating step as in the method of the invention is taken to effect diffusion of the nitrogen out of the copper metallization. As a result, the copper metallization may have an excellent oxidation resistance but is not provided with a reduced electrical resistance, as the present copper metallization.

In an advantageous version of the method a barrier layer, of which the released nitrogen forms part, is deposited prior to the deposition of the copper seed layer. Using this version a discrete barrier layer can be formed of any appropriate material specifically arranged for nitriding, or may already include nitride which advantageously can then be enriched. It is preferred that the barrier layer contains titanium nitride or tantalum nitride. The barrier layer may contain several sublayers that vary in nitrogen content. An advantageous barrier layer is, for example, a stack of tantalum, tantalum nitride and tantalum, the last of which will be nitridated during the heating step.

The nitrogen-containing atmosphere can be any nitrogen containing gas such as $N_2$, $N_2H_2$, $NH_2$, $NH_3$, NO to which an inert gas may be added. By preference, the nitrogen-containing atmosphere is a low-weight gas having an average molar mass of 20 grams per mole or less. It has been found that through the use of such a low-weight gas the coverage of the nitrogen-containing layer is sufficient. Examples of such gases may contain, next to the nitrogen source Ne, He, $H_2$, $CH_4$. Also mixtures of argon and nitrogen with a low argon content can be used, such as a mixture of 80 volume % of $N_2$ and 20 volume % of Ar. In a further version of the method of the invention, the nitrogen-containing atmosphere is an atmosphere which comprises as a nitrogen source $N_2$. It has been found that the use of pure nitrogen gas leads to good results. Such good results, which may be obtained in another nitrogen containing atmosphere as well, include the deposition of a seed layer with a nitrogen content of 15–25 at % of nitrogen, especially about 20 at. %. It is most preferred to use a mixture of nitrogen and neon. Due to the low molar mass of neon, the coverage of the substrate will be excellent.

In another version the copper seed layer comprises at least two sub-layers, only one of which is formed in the nitrogen-containing atmosphere. This is advantageous in that it requires only part, or a sub-layer, of the copper seed layer to be formed in the nitrogen atmosphere. It also advantageously provides flexibility for the subsequent structure and processing steps.

The invention will be described in detail hereinafter, by way of example only, with reference to the accompanying drawings, in which.

Figure 1A:
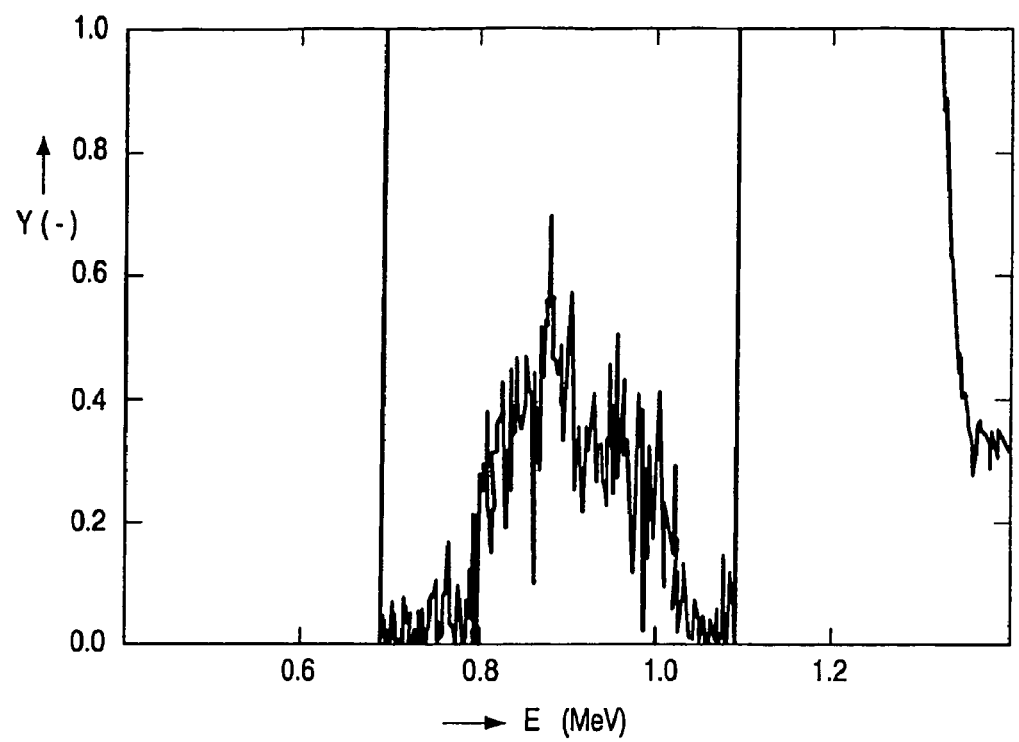
FIG. 1A shows a graph illustrating the RBS spectrum of a nitrogen-containing copper film formed on silicon before the heating step.

As will be appreciated, the electronic device of the invention may be a semiconductor device. However, the electronic device may be a passive network of capacitors and inductors as well. Alternative devices as known by the person skilled in the art, generally being thin-film devices comprising a plurality of layers on a substrate, are within the scope of the invention as well. The copper metallization process whereto the present invention relates generally comprises the deposition of a barrier film upon a semiconductor body and the subsequent sputter deposition of a copper seed layer. In such an embodiment, the deposition of the copper seed layers is followed by the electro-chemical deposition of the copper metallization layer.

As will be understood by any skilled person, in the context of this application the term 'substrate' refers to any layer or stack of layers on which the barrier layer and/or the seed layer are to be deposited. It especially includes a semiconductor substrate in which a plurality of semconductor elements is defined and which may be covered by one or more insulating and interconnecting layers. It will also be understood that the substrate need not have a planar surface. Instead, it can very well be a patterned insulating layer that will result after deposition of the copper metallization in a damascene or dual-damascene structure.

In accordance with the present invention, however, at least part of the copper seed layer is deposited in an atmosphere preferably of pure nitrogen, although a mixture of gases such as, for example, a mixture of 80% $N_2$ and 20% Ar, or a mixture of $N_2$ and He, can offer an appropriately low-weight working gas. In this manner, a nitrogen-containing copper film is then deposited with approximately 20% nitrogen in the film. The film then advantageously decomposes at temperatures, for example, in the range 150–300° C.; this leads to a decrease in the resistance by more than a factor of 10 and, importantly, to the release of nitrogen. This release of nitrogen serves to nitridate the underlying barrier film and so block copper diffusion into the semiconductor body. This seed layer can be advantageously used as a first layer on the silicon substrate of a passive network such as disclosed in WO-A01/61847.

It will, therefore, be appreciated that the invention can advantageously be applied to any appropriate metal/alloy film that can form nitrides, or to existing nitride films that can be enriched in nitrogen. For example, such films comprise titanium or tantalum films or nitrides such as tantalum nitride. The properties of the barrier to copper diffusion thus formed are advantageous particularly with regard to its simplicity of in situ formation and the presence of the already overlying copper seed layer.

Such general aspects are illustrated with reference to FIGS. 1A and 1B. These figures are Rutherford Backscattering Spectrograms wherein the normalized yield Y is given as a function of the backscattering energy E in MeV. The spectrogram was obtained by providing a bundle of He with an energy of 2 MeV on a layer. The energy of the backscattering is a measure of the atomic weight of atoms in the layer. The Normalized Yield Y is defined as the number of returning He counts per unit of applied He, which number is strongly dependent on the specific atom. In the figures experimental results are denoted by a solid line, whereas simulated results are denoted by a dashed line.

Figure 1B:
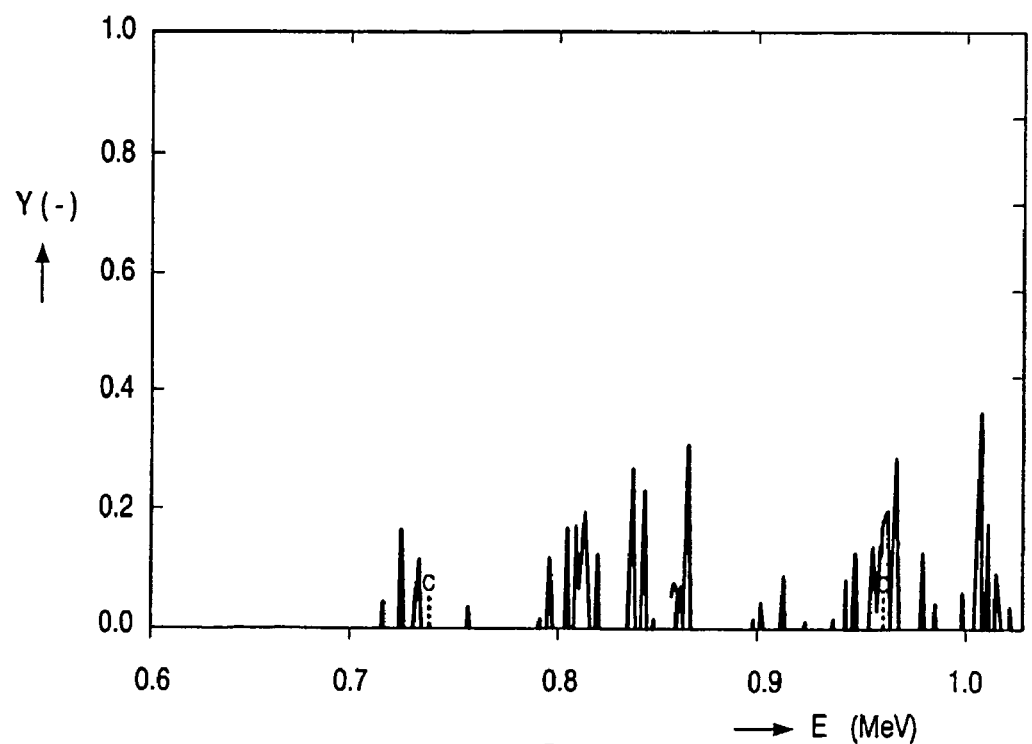
FIG. 1B shows a graph illustrating the RBS spectrum of the copper film of FIG. 1A after the heating step.

The FIGS. 1A and 1B have been obtained for the seed layer. FIG. 1A shows the spectrum for the seed layer that has been obtained through sputtering in a nitrogen-containing atmosphere before the heating. FIG. 1B shows the spectrum for the seed layer after the heating has taken place. As will be observed on comparison of FIG. 1A and FIG. 1B, the amount of nitrogen in the copper seed layer has been substantially reduced. Analysis of this reduction has led to the conclusion that in this particular example an amount of about $20 \times 10^{15}$ $Si_3N_4/cm^2$ will be present at the copper-silicon interface. It can also be seen in the figures that some carbon and some oxygen are also present. The oxygen is believed to originate from some oxidation of the copper to CuO and the carbon is believed to be present in the bundle of He.

Figure 2:
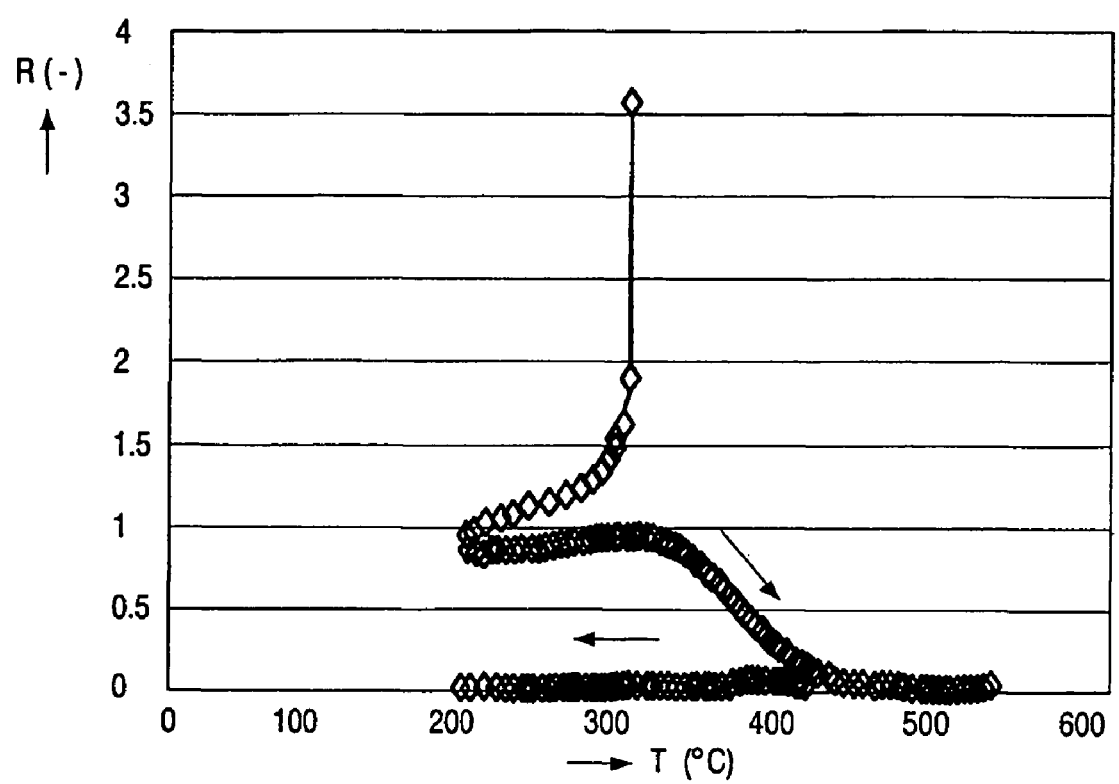
FIG. 2 shows a graph representing the sheet resistance of a copper layer and a nitrogen-containing copper layer on silicon.

FIG. 2 shows results of experiments done with layers of 150 nm pure copper and with 30 nm nitrogen-containing copper on a silicon substrate. In this figure the normalized sheet resistance is set out as a function of the temperature of the furnace in which the substrate with the layers is heated. Having set the sheet resistance at the beginning of the experiment at 1, the pure copper exhibits a sharp increase in sheet resistance since it readily diffuses into the silicon substrate. However, the nitrogen-containing film exhibits a decrease in sheet resistance associated with the release of nitrogen. Advantageously, the copper film is found to be stable on the silicon up to a furnace temperature in the region of 500° C. and this results advantageously from the in situ nitridation of the silicon that acts as a diffusion barrier for the copper. As a consequence, the sheet resistance is kept low after cooling.

Figure 3:
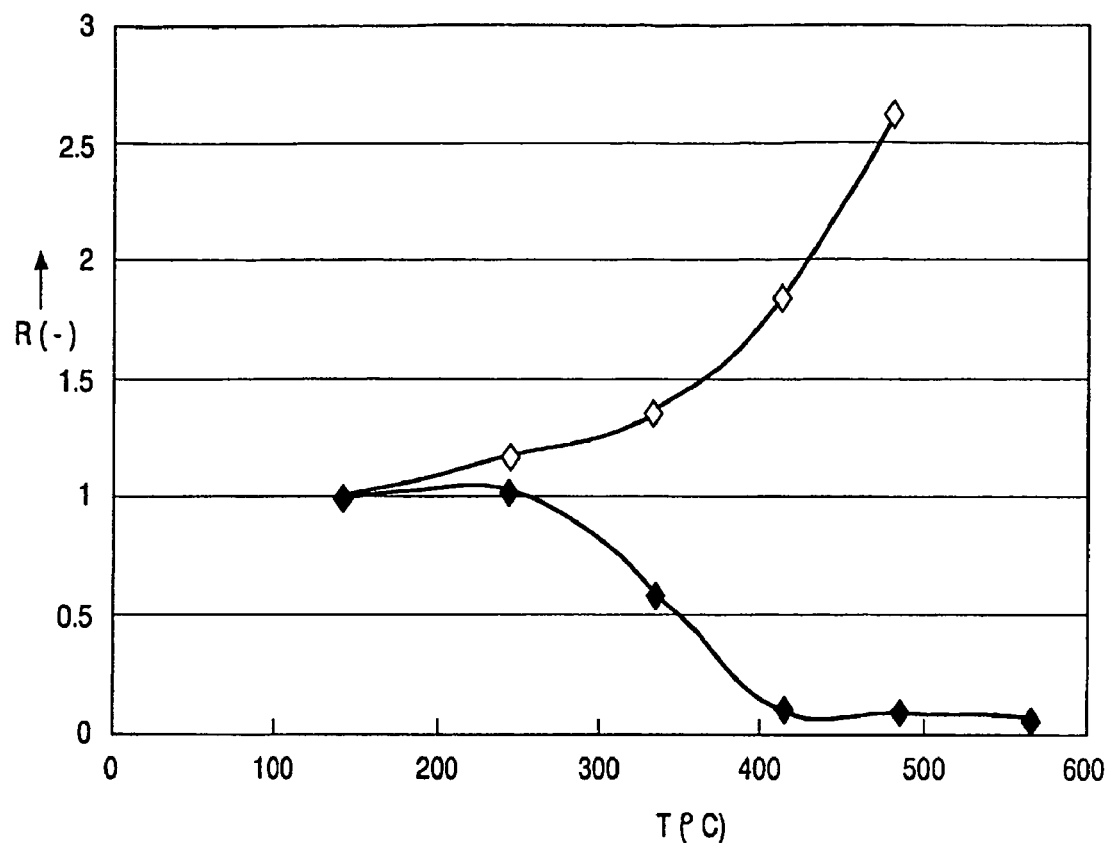
FIG. 3 shows a graph illustrating the sheet resistance of pure copper and nitrogen-containing copper on 10 nm titanium on silicon.

FIG. 3 is a graph illustrating experiments with layers of pure copper and of nitrogen-containing copper on 10 nm titanium on silicon. In this graph the normalized sheet resistance is plotted as a function of the furnace temperature. The sheet resistance of the copper increases with the temperature due to the diffusion of copper and titanium, whereas the nitrogen-containing copper film again exhibits first a decrease in sheet resistance and then stability in the sheet resistance value up to a temperature of 550° C. It can therefore be seen that the presence of the nitrogen advantageously serves to block the copper-titanium inter-diffusion.

Figure 4:
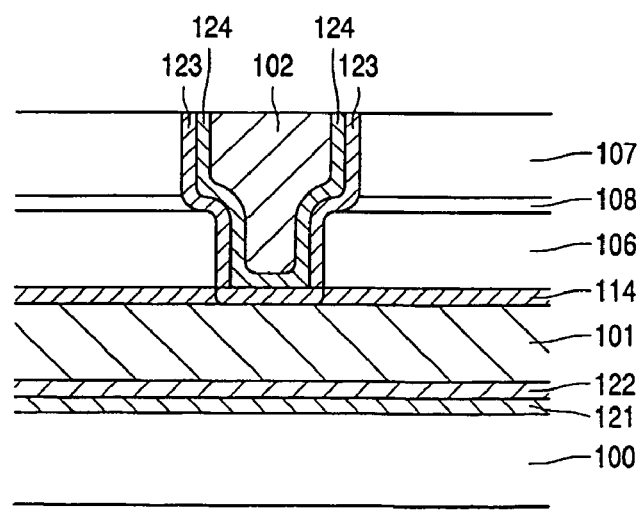
FIG. 4 shows an example of the electronic device of the invention.

FIG. 4. shows an embodiment of the semiconductor device of the invention. A substrate 100, including a plurality of semiconductor elements such as field-effect transistors or bipolar transistors, is covered by an insulating layer not shown. This insulating layer is patterned photolithographically and subsequently etched so as to define trenches. Thereafter, a barrier layer 121 of TaN is deposited using chemical vapor deposition (being a stack of 5 nm Ta, 15 nm TaN and 5 nm Ta). This is followed by deposition of a 200 nm thick seed layer 122 comprising copper. The first 15 nm are obtained through sputtering in an atmosphere of $N_2$ and the next 185 nm are obtained through sputtering in an atmosphere of Ar. After heating to 300° C. during 30 minutes, the copper metallization layer 101 is grown by electroplating copper and by subsequently polishing by way of chemico-mechanical polishing. Then another barrier layer 114 is deposited. Subsequently, another copper metallization layer 102 is provided using the well-known damascene technique. After the provision and patterning of insulating layers 106, 107, separated from one another day a hard mask 108, a barrier layer 123 is provided. The seed layer 124 is sputtered thereon and is heated to allow diffusion of the nitrogen into the barrier layer 123, which is thus enriched in nitrogen. Subsequently, the copper metallization layer 102 is grown by electroplating.

The present invention provides for a method of providing copper metallization on a semiconductor body, including the step of depositing copper in a nitrogen-containing atmosphere so as to form a nitrogen-containing copper seed layer and forming the copper metallization on the seed layer, and also including the step of heating the seed layer so as to release the nitrogen to form part of a barrier layer separating the seed layer from the semiconductor body.

The invention claimed is:

1. A method of manufacturing an electronic device provided with a copper metallization on a substrate, which copper metallization includes a seed layer and a copper metallization layer, which method comprises the steps of:
   depositing copper in a nitrogen-containing atmosphere so as to form a nitrogen containing copper seed layer;
   heating the seed layer so as to release the nitrogen to form part of a barrier layer separating the seed layer from the substrate, and subsequently
   applying the copper metallization layer on the seed layer.

2. A method as claimed in claim 1, wherein the barrier layer of which the released nitrogen forms part, is deposited prior to the deposition of the copper seed layer.

3. A method as claimed in claim 1, wherein the seed layer is heated to a temperature beyond 150° C.

4. A method as claimed in claim 3, wherein the seed layer is heated to a temperature within the range 300° C.–500° C.

5. A method as claimed in claim 1, wherein the nitrogen-containing atmosphere is an atmosphere which comprises $N_2$ as a nitrogen source.

6. A method as claimed in claim 1, wherein the copper seed layer comprises at least two sub-layers, only one of which is formed in the nitrogen-containing atmosphere.

7. A method as claimed in claim 1, wherein the nitride barrier layer comprises either titanium nitride or tantalum nitride.

8. A method as claimed in claim 1, wherein the barrier layer is formed of any appropriate metal that will form a nitride or of a nitride material that can be enriched by the release of the nitride from the nitrogen-containing copper layer.

* * * * *